(12) United States Patent
Kim et al.

(10) Patent No.: US 8,049,274 B2
(45) Date of Patent: Nov. 1, 2011

(54) SEMICONDUCTOR INTEGRATED CIRCUIT AND METHOD OF MANUFACTURING THE SAME

(75) Inventors: Dae-Ik Kim, Yongin-si (KR); Yong-Il Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 391 days.

(21) Appl. No.: 12/230,614

(22) Filed: Sep. 2, 2008

(65) Prior Publication Data

US 2009/0072307 A1   Mar. 19, 2009

(30) Foreign Application Priority Data

Sep. 3, 2007  (KR) .......................... 10-2007-0089211

(51) Int. Cl.
   *H01L 29/66*   (2006.01)
(52) U.S. Cl. ................. 257/331; 257/330; 257/E23.131; 438/587; 438/589

(58) Field of Classification Search .................. 257/330, 257/331, 334, 510, E27.06, E23.131, E21.177; 438/587, 589
See application file for complete search history.

(56) References Cited

U.S. PATENT DOCUMENTS 7,449,354 B2 * 11/2008 Marchant et al. ............... 438/39

FOREIGN PATENT DOCUMENTS

| KR | 10-2004-0093299 A | 11/2004 |
| KR | 10-2005-0081758 A | 8/2005 |
| KR | 10-2006-0060282 A | 6/2006 |
| KR | 10-2007-0002649 A | 1/2007 |

* cited by examiner

*Primary Examiner* — Matthew Landau
*Assistant Examiner* — Colleen E Snow
(74) *Attorney, Agent, or Firm* — Lee & Morse, P.C.

(57) ABSTRACT

A semiconductor integrated circuit includes a semiconductor substrate, a plurality of trenches formed to extend in one direction in the semiconductor substrate, at least one connecting trench connecting at least two of the plurality of trenches to each other, a plurality of trench transistors including a plurality of gate electrodes, each gate electrode partially filling a corresponding trench, and a capping layer filling the at least one connecting trench.

24 Claims, 8 Drawing Sheets

SEMICONDUCTOR INTEGRATED CIRCUIT AND METHOD OF MANUFACTURING THE SAME

BACKGROUND OF THE INVENTION

1. Field of the Invention

Embodiments relate to a semiconductor integrated circuit and a method of manufacturing the same. More particularly, embodiments relate to a semiconductor integrated circuit that has a simplified manufacturing process and a method of manufacturing the same.

2. Description of the Related Art

With the high integration of semiconductor devices, sizes of metal-oxide semiconductor (MOS) devices are steadily decreasing, while their functionality has been improving. As high integration of semiconductor devices progresses, intervals between transistors in a plurality of transistors decrease. Therefore, research have been conducted on a method in which transistors are formed in a semiconductor substrate such that channel lengths are not decreased, even when the transistors are disposed at narrow intervals.

In order to form the transistors in the semiconductor substrate at small intervals, a width of a photoresist pattern used when forming trenches where gate electrodes of the transistors are disposed needs to decrease. However, reducing widths of the photoresist pattern depends on a resolution of a stepper. Accordingly, the following method has been explored. First, a photoresist pattern with openings having a relatively large width is formed. Second, an etching inductive material is applied to the openings. Third, an etching process is performed, resulting in two trenches for each opening. However, when two trenches are formed for each opening, an additional process that separates the two trenches from each other needs to be performed to prevent conductive material in each trench from short-circuiting. As a result, manufacturing process time and complexity increases.

SUMMARY OF THE INVENTION

Embodiments are therefore directed to a semiconductor integrated circuit and a method of manufacturing the same, which substantially overcome one or more problems of the related art.

Embodiments may provide a semiconductor integrated circuit and a method of manufacturing the same having a simplified manufacturing process.

Embodiments may provide a semiconductor integrated circuit and a method of manufacturing the same having a faster manufacturing process.

At least one of the above and other advantages may be realized by providing a semiconductor integrated circuit including a semiconductor substrate, a plurality of trenches formed to extend in one direction in the semiconductor substrate, at least one connecting trench connecting at least two of the plurality of trenches to each other, trench transistors including a plurality of gate electrodes, each gate electrode partially filling a corresponding trench, and a capping layer filling the at least one connecting trench.

At least one of the above and other advantages may be realized by providing a method of manufacturing a semiconductor integrated circuit, the method including forming a plurality of trenches and at least one connecting trench in a semiconductor substrate, the plurality of trenches extending in one direction, the at least one connecting trench connecting at least two of the plurality of trenches, partially filling the plurality of trenches to form a corresponding plurality of gate electrodes, and filling the at least one connect trench to form a capping layer.

At least one of the above and other advantages may be realized by providing a method of manufacturing a semiconductor integrated circuit, the method including forming an etching auxiliary film on a semiconductor substrate, forming a mask film pattern on the etching auxiliary film, the mask film pattern including a plurality of first openings that extend in one direction and at least one second opening connecting at least two of the first openings, sequentially forming an etching inductive film and a separation insulating film on the mask film pattern, removing the separation insulating film except for a portion of the separation insulating film in the first openings, etching the etching inductive film, forming two separated trenches in a region of the semiconductor substrate corresponding to each of the first openings, and forming at least one connecting trench in a region of the semiconductor substrate corresponding to the at least one second opening, and partially filling each of the plurality of trenches to form gate electrodes in the semiconductor substrate.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF EMBODIMENTS

Figure 1:
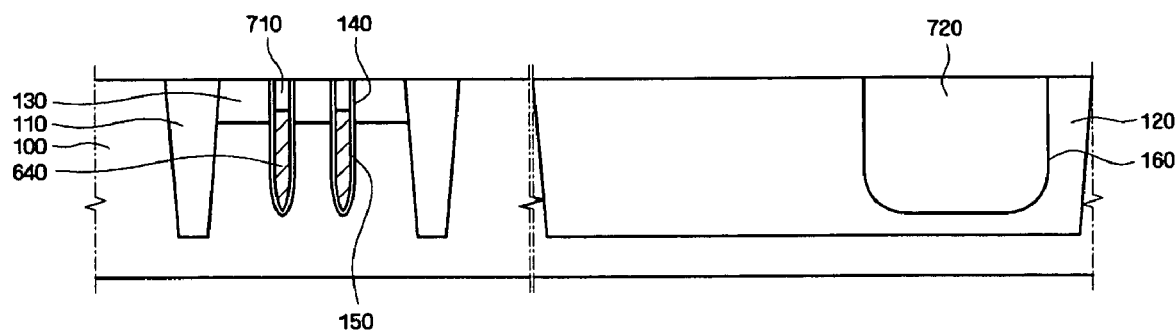
FIG. 1 illustrates a schematic cross-sectional view of a semiconductor integrated circuit according to an embodiment of the invention.

Korean Patent Application No. 10-2007-0089211, filed on Sep. 3, 2007, in the Korean Intellectual Property Office, and entitled: "Semiconductor Integrated Circuit and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In some embodiments, well-known process procedures, structures, and techniques will not be described in detail to avoid misinterpretation of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, a semiconductor integrated circuit according to an embodiment of the invention will be described with reference to FIG. 1. FIG. 1 illustrates a schematic cross-sectional view of a semiconductor integrated circuit according to an embodiment of the invention.

Referring to FIG. 1, a semiconductor substrate 100 may include a first region, in which a gate electrode 640, a source/drain region 130, and so forth may be formed, and a second region where the gate electrode 640, the source/drain region 130, and so forth are not formed.

The semiconductor substrate 100 may be a silicon semiconductor substrate, a silicon on insulator (SOI) semiconductor substrate, a gallium-arsenide (GaAs) semiconductor substrate, a silicon-germanium (SiGe) semiconductor substrate, a ceramic semiconductor substrate, a quartz semiconductor substrate, or a glass semiconductor substrate for display. A P-type semiconductor substrate may be used as the semiconductor substrate 100. Although not shown in the drawings, a P-type epitaxial layer may be grown on the semiconductor substrate 100.

First and second element separation regions 110 and 120, which are formed in the semiconductor substrate 100, may define active regions. Each of the first and second element separation regions 110 and 120 may be a shallow trench isolation (STI) or field oxide (FOX) using a local oxidation of silicon (LOCOS) method.

A trench transistor may include a trench 140, a gate insulating film 150, the gate electrode 640, a first capping layer 710, and the source/drain region 130. The trenches 140 may be recessed in the active region defined by the first element separation regions 110. The trenches 140 may extend in one direction in the semiconductor substrate 100.

The gate insulating film 150 may be conformally formed on an inner surface of the trench 140. At this time, the gate insulating film 150 may be made of a silicon oxide film, SiON, $Ge_xO_yN_z$, $Ge_xSi_yO_z$, high dielectric materials, a combination thereof, or a laminated film formed by sequentially laminating them. The high dielectric materials may include $HfO_2$, $ZrO_2$, $Al_2O_3$, $Ta_2O_5$, hafnium silicate, zirconium silicate, or a combination thereof, but the invention is not limited thereto.

The gate electrode 640 may be formed on the gate insulating film 150 to bury at least a portion of the trench 140. The gate electrode 640 may be a metal film. For example, the gate electrode 640 may contain a material, such as W or TiN. However, the invention is not limited thereto, and the gate electrode 640 may include films that are made of other materials, if necessary. In this embodiment, the gate electrode 640 is located in the trench 140 and does not protrude above an upper surface of the semiconductor substrate 100. The gate electrode 640 may be formed in the semiconductor substrate 100. Thus, the channel length may be increased.

The source/drain region 130 may be formed in the active regions located at both sides of the gate electrode 640. For example, when the trench transistor is an N type, the source/drain region 130 may be formed by implanting N-type impurities. The first capping layer 710 may be formed on the gate electrode 640 to insulate the gate electrode 640 from an external conductive material.

The second element separation region 120 may also be formed in the semiconductor substrate 100. FIG. 1 illustrates a cross-sectional view of a state where the second element separation region 120 is separated from the first element separation region 110. However, the second element separation region 120 may be connected to the first element separation region 110. That is, the second element separation region 120 may be the FOX using the LOCOS method or the STI, like the first element separation region 110. A connecting trench 160 may be formed in the second element separation region 120.

The connecting trench 160 may connect at least two trenches 140 to each other. That is, one end of at least two adjacent trenches 140 among the plurality of trenches 140 may be connected by the connecting trench 160. The connecting trench 160 may connect one end of four adjacent trenches 140 using a simpler mask to form the connecting trench 160. In this case, connecting trenches 160 may be alternately formed for one end of a first set of four trenches 140 and for an opposite end of an adjacent set of four trenches 140.

In a modification of this embodiment, the connecting trench 160 may connect all of the plurality of trenches 140 in the semiconductor substrate 100. Specifically, one end of the plurality of trenches 140 may be connected by the connecting trench 160, and the other ends of the plurality of trenches 140 may be connected by the connecting trench 160.

A second capping layer 720 may fill the connecting trench 160. The first and second capping layers 710 and 720 may be made of an insulating material, e.g., SiN. The second capping layer 720 may separate the gate electrodes 640 in the plurality of trenches 140 from each other. That is, the second capping layer 720 may prevent the gate electrodes 640 from being short-circuited.

One or more interlayer insulating films (not shown) may be sequentially laminated on the semiconductor substrate 100 where the trench transistors are formed. The interlayer insulating film may be, for example, a nitride film, an oxide film, or the like. A contact hole (not shown) through the interlayer insulating film may be formed on the source/drain region 130 of the trench transistor.

In this embodiment, a contact area may be increased since the gate electrode 640 does not protrude above the upper surface of the semiconductor substrate 100. Thus, a separate spacer may not be formed.

Figure 2:
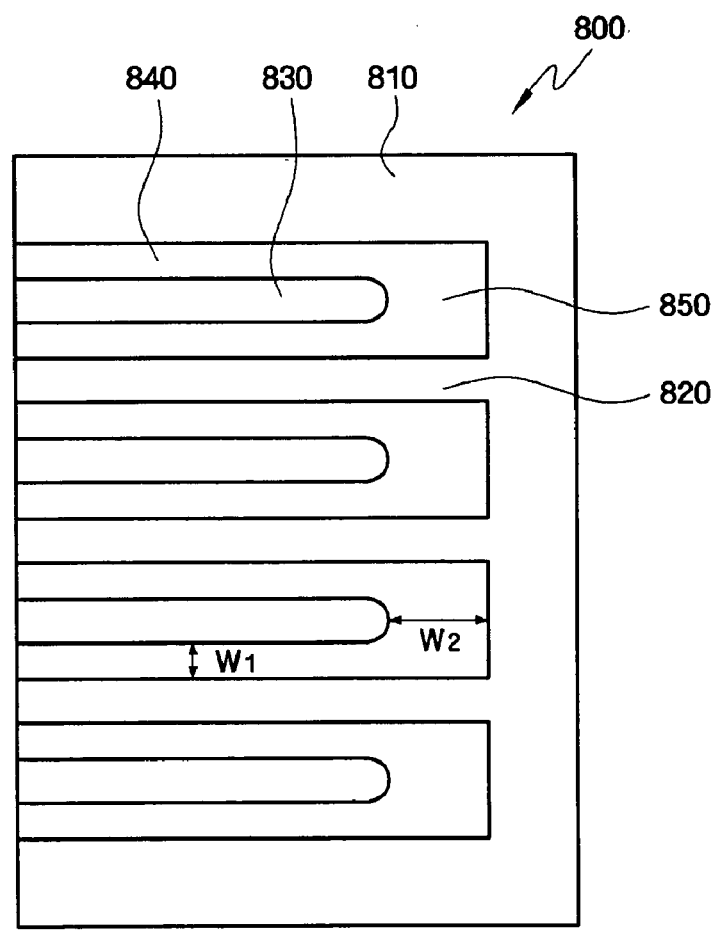
FIG. 2 illustrates a layout diagram of an optical mask used in manufacturing a semiconductor integrated circuit according to an embodiment of the invention.
Figure 3:
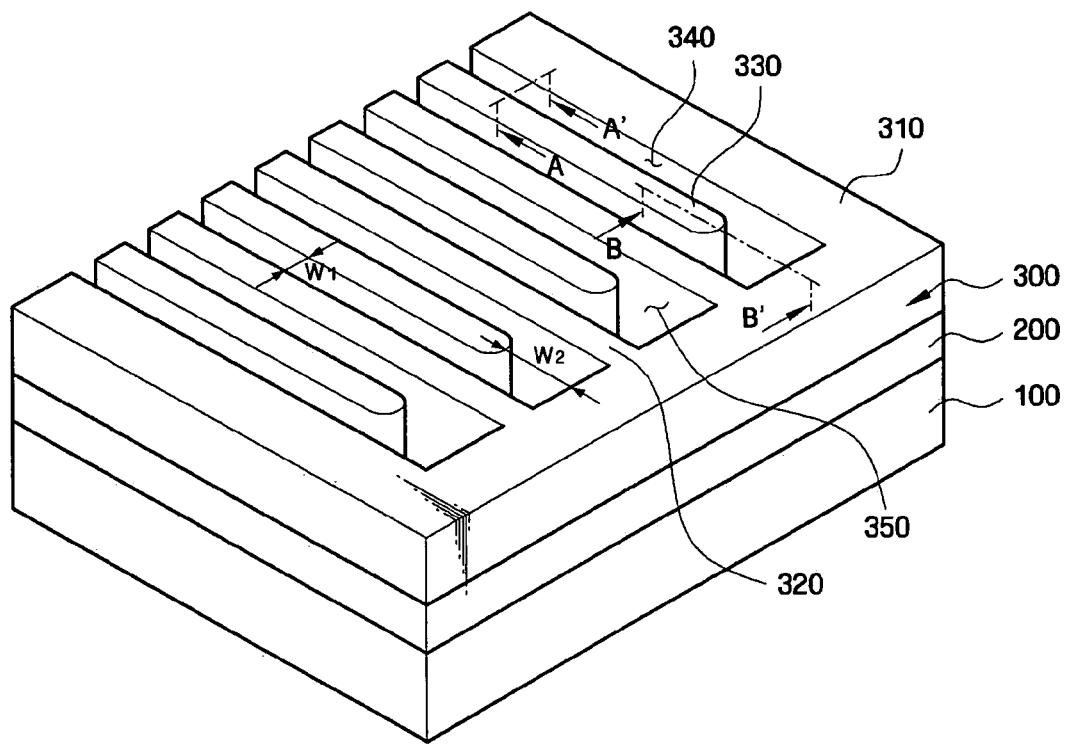
FIG. 3 illustrates a perspective view of a semiconductor integrated circuit patterned by an optical mask shown in FIG. 2.

A method of manufacturing a semiconductor integrated circuit according to an embodiment of the invention will now be described with reference to FIGS. 1 to 11. FIG. 2 illustrates a layout diagram of an optical mask that may be used in manufacturing a semiconductor integrated circuit according to an embodiment of the invention. FIG. 3 illustrates a perspective view of a semiconductor integrated circuit patterned using the optical mask shown in FIG. 2. FIGS. 4 to 11 illustrate cross-sectional views of sequential stages of a method of manufacturing a semiconductor integrated circuit according to an embodiment of the invention.

Referring to FIGS. 2 and 3, an etching auxiliary film 200 may be formed on the semiconductor substrate 100 where the trench transistors or the like are formed, a mask material may be provided on the etching auxiliary film 200, and optical mask patterns 810, 820, and 830 may be formed on the mask material using an optical mask 800.

Figure 4:
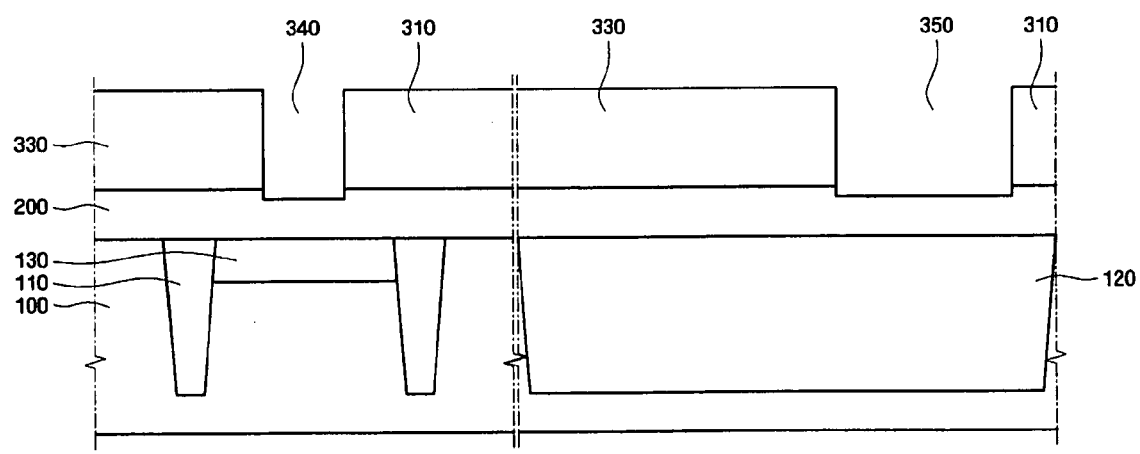
FIGS. 4 to 11 illustrate cross-sectional views of sequentially stages in a method of manufacturing a semiconductor integrated circuit according to an embodiment of the invention.

Referring to FIG. 4, the first element separation region 110 and the second element separation region 120 may be formed on the semiconductor substrate 100. The trench transistor may be formed on the region defined by the first element separation region 110. The trench transistor may include the gate insulating film 150, the gate electrode 640, the first capping layer 710, and the source/drain region 130.

Then, the etching auxiliary film 200 may be formed on the semiconductor substrate 100 where the above-described elements are formed. The etching auxiliary film 200 may be formed of the same material, e.g., polysilicon, as an etching inductive film 400 described in detail below.

Then, a mask film pattern 300 may be formed on the etching auxiliary film 200 using the optical mask 800. The mask film pattern 300 may define first openings 340 and second openings 350. The first openings 340 may extend in one direction. Each of the second openings 350 may connect at least two of the first openings 340 and may have a larger width than the first openings 340.

Referring again to FIG. 2, the optical mask 800 may include patterns 810, 820, and 830 made of an opaque material, e.g., Cr, on a transparent substrate (not shown). The optical mask 800 may include the optical mask edge patterns 810, the first optical mask internal patterns 820, and the second optical mask internal patterns 830. The optical mask edge pattern 810 may include a pair of opposite sides and another pair of sides that cross the pair of opposite sides. That is, the optical mask edge pattern 810 may have a rectangular shape. The optical mask edge pattern 810 may have corners provided with chamfers or protruding portions, if necessary.

The plurality of first optical mask internal patterns 820 may be disposed in parallel to each other and may be connected to one of the pair of opposite sides of the optical mask edge pattern 810. The second optical mask internal patterns 830 may be disposed in parallel to the first optical mask internal patterns 820. The second optical mask internal patterns 830 and the first optical mask internal patterns 820 may be alternately formed. For example, when one of the first optical mask internal patterns 820 is connected to one side of the optical mask edge pattern 810, the second optical mask internal pattern 830 adjacent to one of the first optical mask internal patterns 820 may not be connected to one side of the optical mask edge pattern 810.

First openings 840 of the optical mask 800 and second openings 850 of the optical mask 800 may be defined by the optical mask edge pattern 810, the first optical mask internal patterns 820, and the second optical mask internal patterns 830. A width W2 of the second opening 850, i.e., a distance between an end of the second optical mask internal pattern 830 to the optical mask edge pattern 810, may be larger than a width W1 of the first opening 840, i.e., a distance between the second mask internal pattern 830 and the first mask internal pattern 820. The width W2 of the second opening 850 may be at least two times larger than the width W1 of the first opening 840. Together, a pair of the first openings 840 and a second opening 850 may have a "U" shape. Specifically, the first openings 840 and the second openings 850 may be disposed such that a plurality of "U" shapes is continuously disposed.

Referring to FIGS. 2 to 4, light may be irradiated onto a photoresist (not shown) using the above-described optical mask 800, thereby forming the mask film pattern 300.

The mask film pattern 300 may correspond to the optical mask edge pattern 810, the first optical mask internal patterns 820, and the second optical mask internal patterns 830 of the optical mask 800. That is, the mask film pattern 300 may include a rectangular edge pattern 310, a plurality of first internal patterns 320, and a plurality of second internal patterns 330. The plurality of first internal patterns 320 may be disposed in parallel to each other and ends thereof may be connected to opposite sides of the edge pattern 310. The plurality of second internal patterns 330 may be alternately disposed together with the plurality of first internal patterns 320. When the first internal pattern 320 is connected to one side of the edge pattern 310, the second internal pattern 330 adjacent to the first internal pattern 320 is not connected to one side of the edge pattern 310, but to the other side of the edge pattern 310. Therefore, the first opening 340 and the second opening 350 may have a "U" shape. Specifically, the first openings 340 and the second openings 350 may be disposed such that the plurality of "U" shapes is continuously disposed. That is, the plurality of first openings 340 may extend in one direction, and the second openings 350 may connect at least one end or the other end of the first openings 340. In this case, the width W2 of the second opening 350 may be larger than the width W1 of the first opening 340. The width W2 of the second opening 350 may be at least two times larger than the width W1 of the first opening 340.

Figure 5:
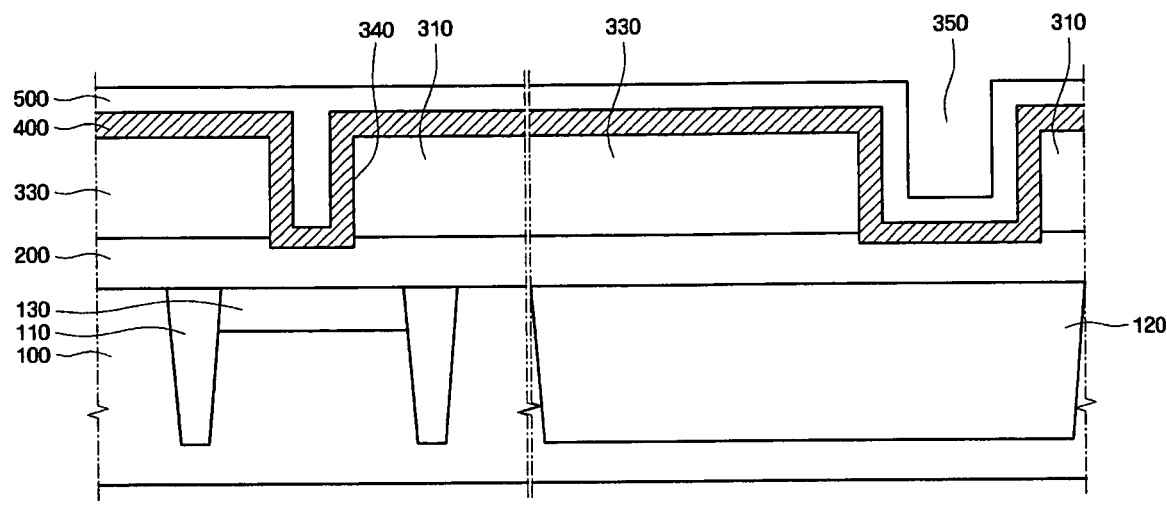

Then, referring to FIG. 5, an etching inductive film 400 and a separation insulating film 500 may be sequentially deposited to have a uniform thickness on the edge pattern and the second internal pattern 310 and 330 of the mask film pattern 300, e.g., using a CVD method or a sputtering method.

The etching inductive film 400 may induce an etching path at the time of forming the trench 140 of FIG. 1 and the connecting trench 160 of FIG. 1 in the following processes. The etching inductive film 400 may be formed of the same material as the etching auxiliary film 200. The etching inductive film 400 may be formed of a different material, i.e. a material having a different etching characteristic, from that of the separation insulating film 500. For example, the etching inductive film 400 may be formed of polysilicon.

The etching inductive film 400 may be conformally deposited on top surfaces of the edge pattern 310 and the second internal pattern 330 of the mask film pattern 300, sides and a bottom surface of the first opening 340, sides and a bottom surface of the second opening 350. After the etching inductive film 400 is deposited, spaces may remain where the etching inductive film 400 does not fill the first opening 340 and the second opening 350. Specifically, the etching inductive film 400 may be conformally deposited to have a thickness of, for example, 30 to 35 nm, e.g., 32 nm. However, the deposited thickness of the etching inductive film 400 is not limited thereto.

Then, the separation insulating film 500 may be conformally deposited on the etching inductive film 400. The separation insulating film 500 may be conformally deposited to have a thickness of, for example, 35 to 45 nm, e.g., 40 nm. However, the deposited thickness of the separation insulating film 500 is not limited thereto. Here, the separation insulating film 500 may completely fill the first opening 340 and a space may remain where the separation insulating film 500 does not completely fill the second opening 350.

The separation insulating film 500 may be made of an insulating material, for example, SiN. In the following etching process, when the etching inductive film 400 is etched, the separation insulating film 500 separates the etching inductive film 400, thereby forming the two separated trenches in the first opening 340.

Figure 6:
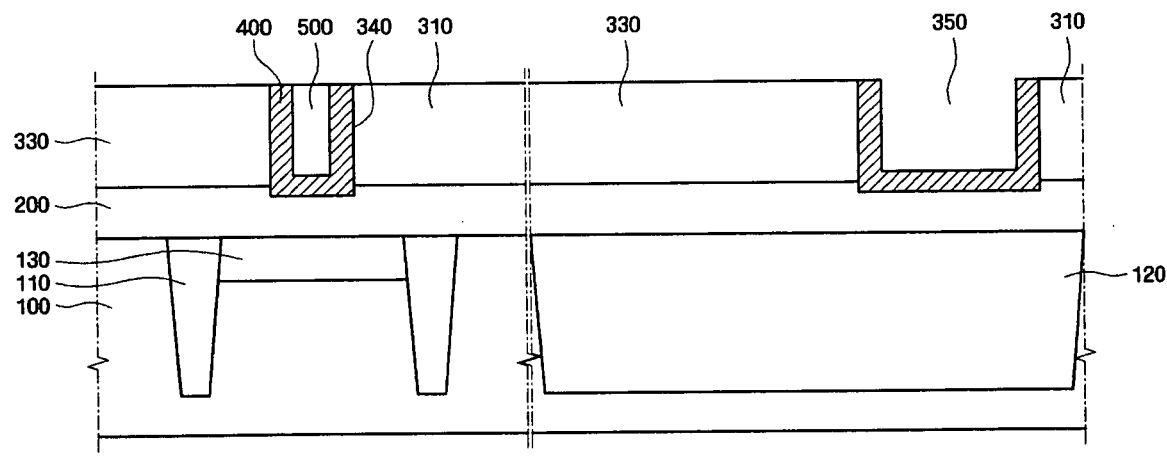

Then, referring to FIG. 6, the separation insulating film 500 may be removed, e.g., by an etching process. A wet etching process or an isotropic dry etching process may be used as the etching process. Most portions of the separation insulating film 500 on the etching inductive film 400 may be removed by the isotropic dry etching process. However, the separation insulating film 500 filling the first opening 340 may remain even after the etching process. Therefore, the etching inductive film 400 may be separated into two portions along both sides of the separation insulating film 500. Meanwhile, since etchant may permeate the space remaining in the second opening 350, the separation insulating film 500 in the second opening 350 may be completely removed. The etching inductive film 400 below the separation insulating film 500 may be completely exposed wherever the separation insulating film 500 has been removed.

Then, an etch-back process may be performed on the etching inductive film 400, thereby removing the etching inductive film 400 on the edge pattern 310 and the second internal pattern 330. Although not shown in the drawings, the etching inductive film 400 that exists on the first internal pattern may also be removed. Meanwhile, the etching inductive film 400 in the first opening 340 and the second opening 350 remains without being removed. That is, the etching inductive film 400 remains on the sides and bottom surfaces of the first opening 340 and the second opening 350. Further, the etching inductive film 400 on the bottom surface of the first opening 340 is covered by the separation insulating film 500, i.e., is not exposed.

Figure 7:
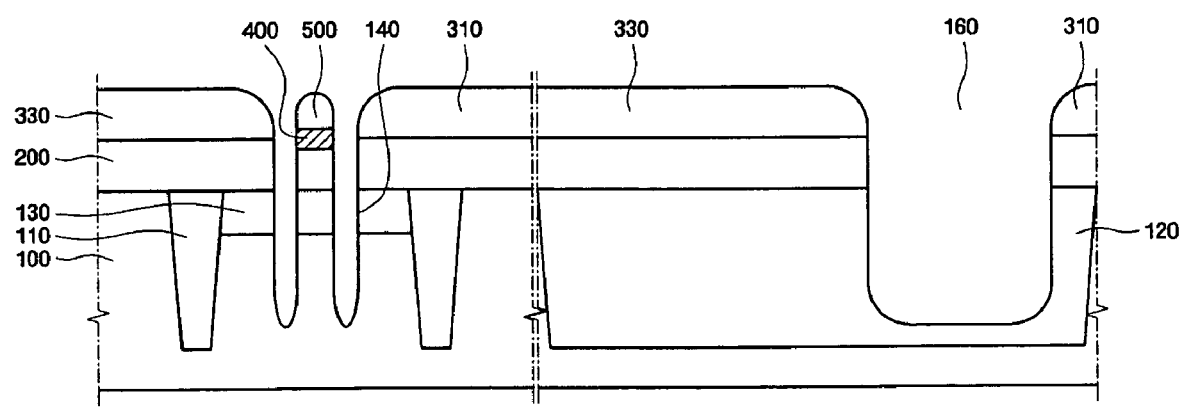

Then, referring to FIG. 7, the etching inductive film 400 may be etched. In this case, a selection ratio of the etchant may be adjusted such that the separation insulating film 500 is not etched.

The first opening 340 may be etched downward along the etching inductive film 400 formed on the sides of the first opening 340. Although the etching inductive film 400 is also formed on the bottom surface of the first opening 340, an upper portion of the first opening 340 is blocked by the separation insulating film 500. Thus, the bottom surface of the first opening 340 is not etched. Meanwhile, the etching auxiliary film 200, which may be of the same material as the etching inductive film 400, may be etched when the etching inductive film 400 is etched. Further, the semiconductor substrate 100, which may be made of the same material as the etching auxiliary film 200 and the etching inductive film 400, may be etched at the same time as the etching of the etching inductive film 400. As a result, the trench 140 may be formed up to the inner portion of the semiconductor substrate 100 along the etching inductive film 400 on the sides of the first opening 340. That is, two trenches 140 may be formed for each first opening 340. As compared with the case where a narrow photoresist pattern is used to form each trench 140, a photoresist having a relatively large width is formed. The first opening 340 is formed and two trenches 140 are then formed therefrom, preventing the process from being limited by the resolution of the stepper.

The etching inductive film 400 on the sides and bottom surface of the second opening 350, and the etching auxiliary film 200 and the semiconductor substrate 100, which may be formed of the same material as the etching inductive film 400, below the etching inductive film 400, may be removed during etching. Therefore, when the etching inductive film 400 is etched, the connecting trench 160 having a size corresponding to the width of the second opening 350 may be formed.

Figure 8:
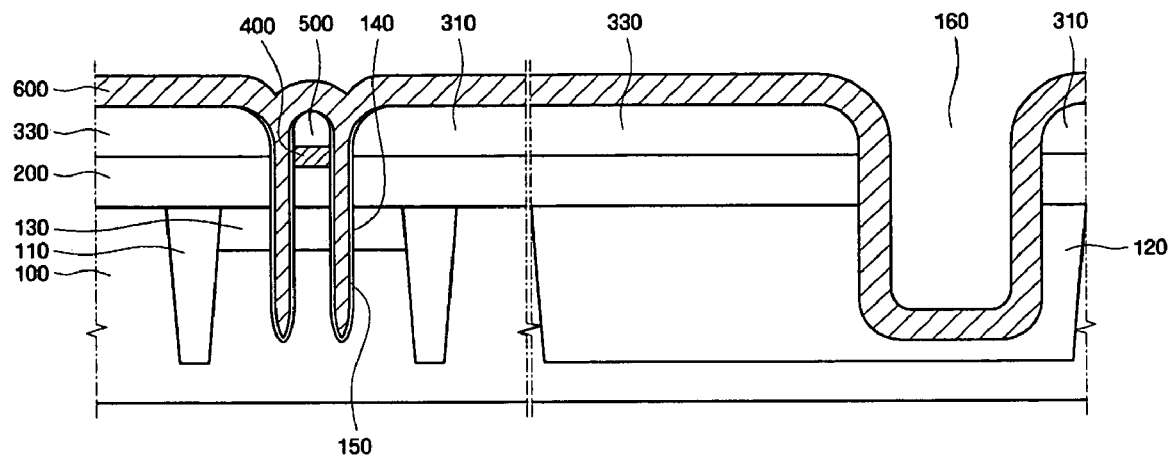

Then, referring to FIG. 8, the gate insulating film 150 may be formed in the trench 140. Then, a gate electrode conductive material 600 may be deposited on an entire surface of the resultant structure, e.g., using a CVD method or a sputtering method. Therefore, the gate electrode conductive material 600 may be conformally deposited on the edge pattern 310 and the first internal pattern 320 of the mask film pattern 300, and the trench 140. In this case, the gate electrode conductive material 600 may be conformally deposited to have a thickness of, for example, 35 to 45 nm, e.g., 40 nm, but the deposited thickness of the gate electrode conductive material 600 is not limited thereto. The gate electrode conductive material 600 may completely fill trench 140. Meanwhile, the gate electrode conductive material 600 may be deposited on the sides and bottom surface of the connecting trench 160. However, since the connecting trench 160 has a width that is larger than the width of the trench 140, a space may remain in the connecting trench 160. The gate electrode conductive material 600 may include a metal material, for example, W, TiN, or the like.

Figure 9:
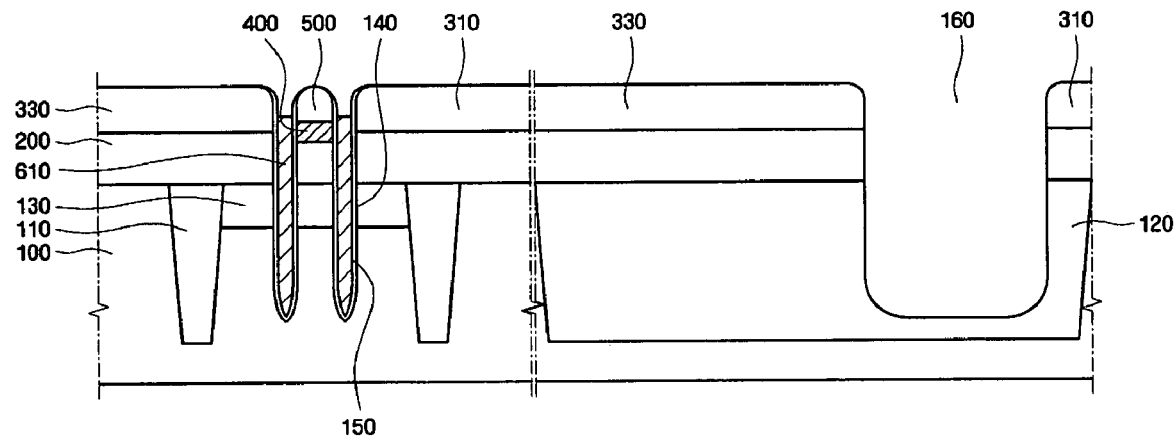

Then, referring to FIG. 9, the deposited gate electrode conductive material 600 on the edge pattern 310 and the first internal pattern of the mask film pattern 300 and in the connecting trench 160 may be completely removed, e.g., using an etch-back process. Therefore, only a gate electrode conductive material 610 filling into the trench 140 remains.

Figure 10:
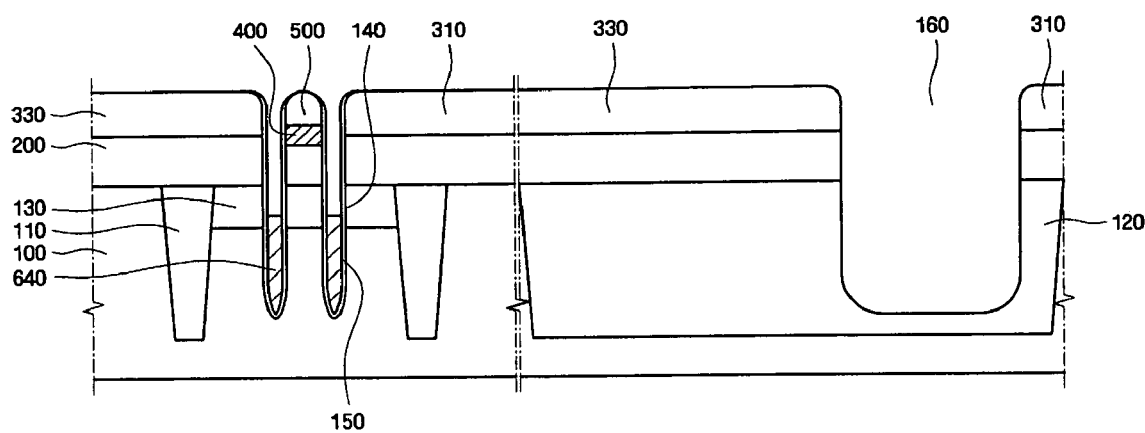

Then, referring to FIG. 10, the gate electrode conductive material 610 may be partially removed, e.g., using an etch-back process. In particular, the gate electrode conductive material 610 above the upper surface of the semiconductor substrate 100 may be removed. The gate electrode conductive material 610 remaining in the semiconductor substrate 100 thereby forms the gate electrode 640.

Figure 11:
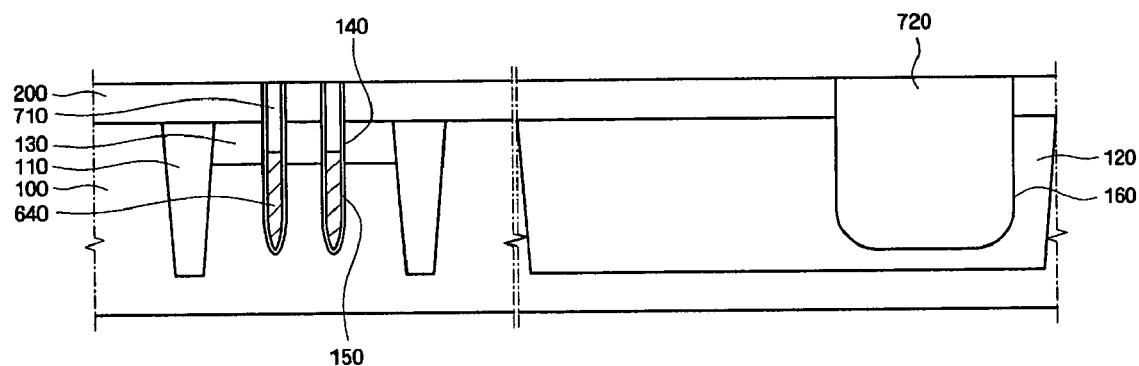

Then, referring to FIG. 11, an insulating material may fill the trench 140 and the connecting trench 160. Thus, the first capping layer 710 protecting the gate electrode 640 is formed in the trench 140 and the second capping layer 720 is formed in the connecting trench 160. The second capping layer 720 may insulate at least two trenches 140 adjacent to each other. That is, adjacent gate electrodes 640 may be separated from each other by the second capping layer 720.

Then, referring to FIG. 1, the etching auxiliary film 200, an upper portion of the first capping layer 710 and an upper portion of the second capping layer 720 may be removed, e.g., by an etch-back process.

Then, one or more interlayer insulting layers (not shown) may be sequentially laminated on the semiconductor substrate 100. The interlayer insulating film may be, for example, a nitride film, an oxide film, and the like. The conductive material may be deposited on the interlayer insulating film, and a contact hole (not shown) that connects the conductive material to the source/drain region 130 may be formed, thereby completing the semiconductor integrated circuit.

According to the method of manufacturing a semiconductor integrated circuit according to an embodiment of the invention, the widths of the first opening 340 and the second opening 350 may be different from each other, and a separate process for isolating the gate electrode 640 in the trench 140 may be eliminated. Therefore, the manufacturing process may be simplified and sped up.

Figure 12:
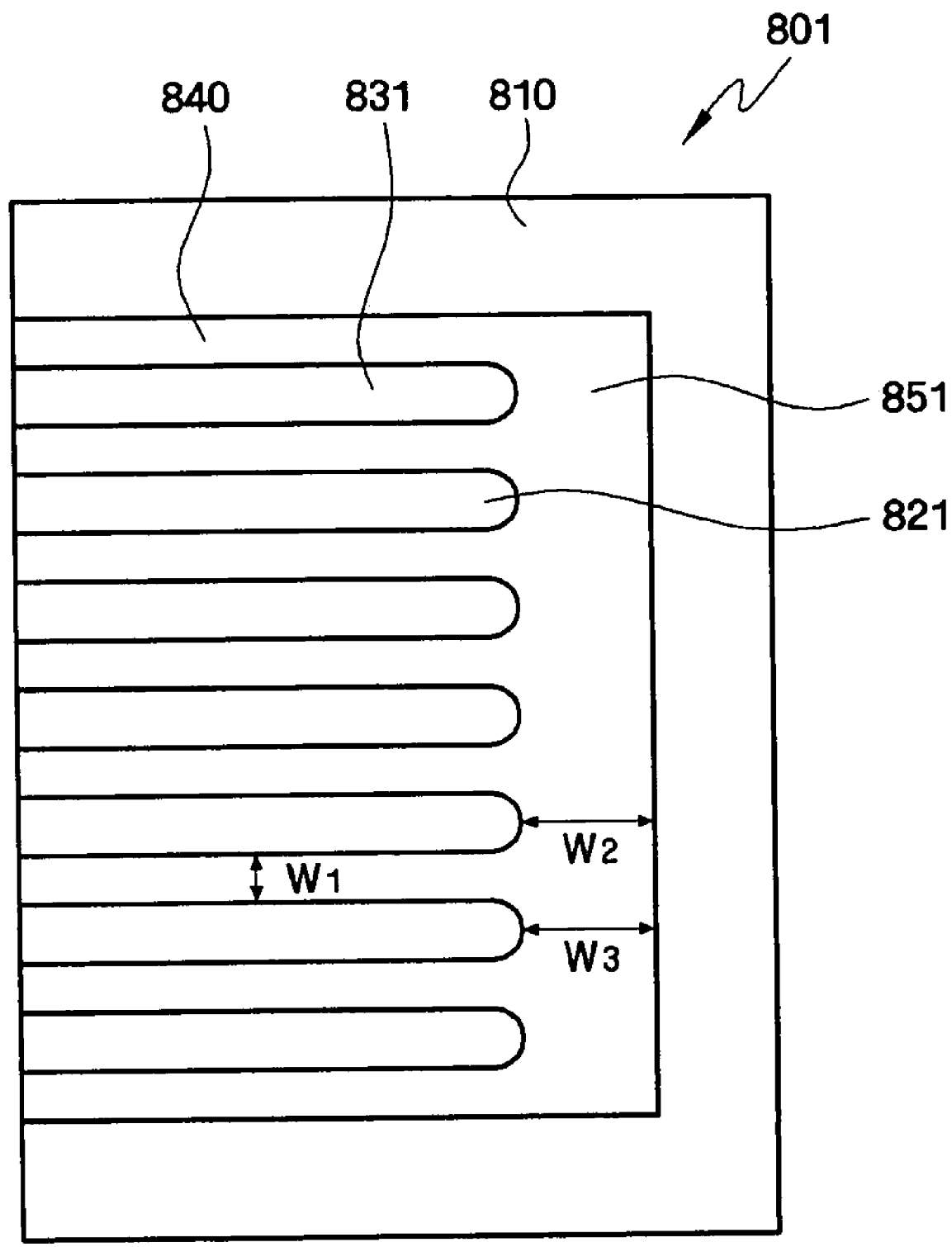
FIG. 12 illustrates a layout diagram of an optical mask used in manufacturing a semiconductor integrated circuit according to another embodiment of the invention.
Figure 13:
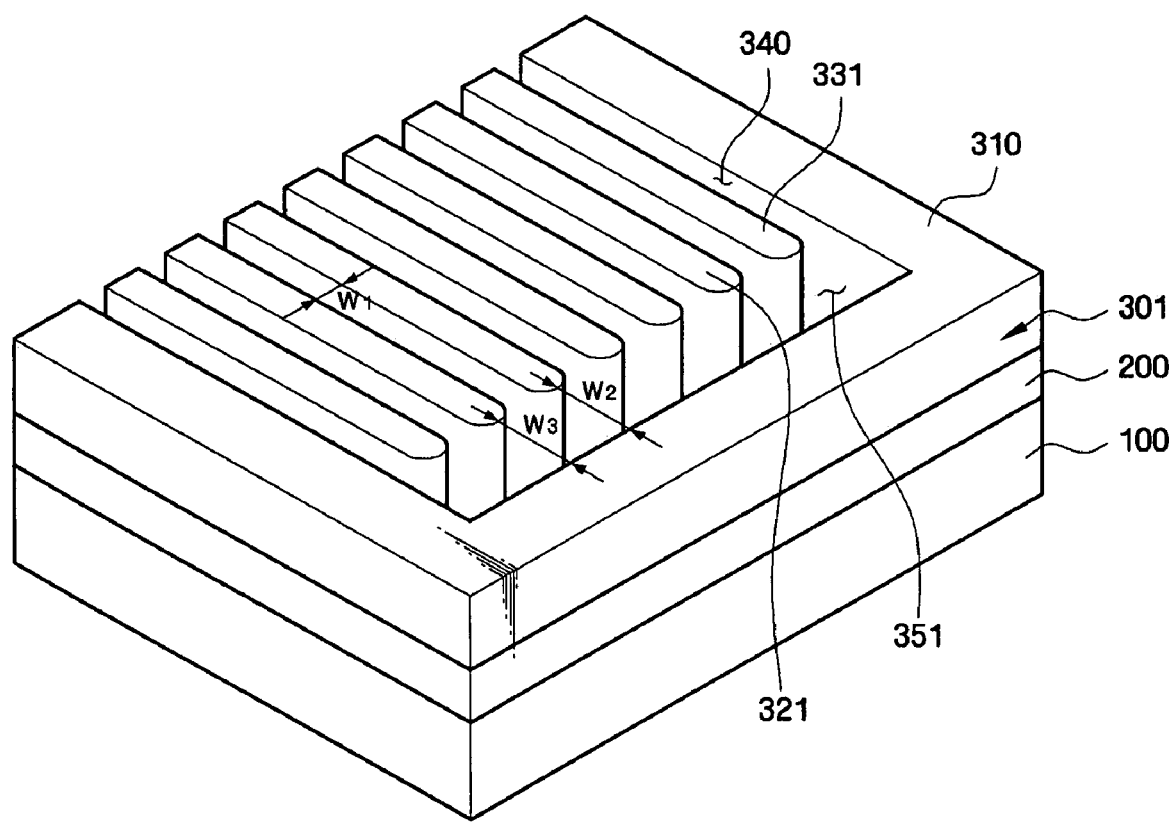
FIG. 13 illustrates a perspective view of a semiconductor integrated circuit patterned by an optical mask shown in FIG. 12.

A method of manufacturing a semiconductor integrated circuit according to another embodiment of the invention will be described with reference to FIGS. 12 and 13. In another embodiment of the invention, substantially the same constituent elements as those in the embodiment of the invention are denoted by the same reference numerals, and the detailed description thereof will not be repeated. FIG. 12 illustrates a layout diagram of an optical mask that may be used in manufacturing a semiconductor integrated circuit according to another embodiment of the invention. FIG. 13 illustrates a perspective view of a semiconductor integrated circuit patterned by the optical mask shown in FIG. 12.

Referring to FIGS. 12 and 13, an optical mask 801 according to another embodiment of the invention may differ from the optical mask 800 of FIG. 2 in shapes of the first optical mask internal patterns 821 and the second optical mask internal patterns 831. In this embodiment, the optical mask 801 may include the optical mask edge pattern 810, the first optical mask internal patterns 821, and the second optical mask internal patterns 831. The optical mask edge pattern 810 may have the same shape as the optical mask edge pattern 810 of the previous embodiment, e.g., a rectangular shape. The first optical mask internal pattern 821 may be parallel to a pair of sides of the optical mask edge pattern 810 and may be substantially vertical to another pair of sides. The plurality of first optical mask internal patterns 821 may be parallel to each other, and both ends of the first optical mask internal patterns 821 may be spaced apart from the optical mask edge pattern 810. The second optical mask internal pattern 831 may have the same shape as the first optical mask internal pattern 821. The second optical mask internal pattern 831 and the first optical mask internal pattern 821 may be alternately disposed and parallel to each other.

The first openings 840 of the optical mask 801 may have the width W1 between the first optical mask internal pattern 821 and the second optical mask internal pattern 831. The second openings 851 may connect all of one side of the first openings 840. Widths W2 and W3 of the second openings 851, i.e., between ends of the second and first optical mask patterns 831, 821 and the optical mask edge pattern 810, may be larger than the width W1 of the first opening 840, e.g., at least two times larger than that of the first opening 840.

As illustrated in FIG. 13, a mask film pattern 301 may be formed in accordance with the optical mask edge pattern 810, the first optical mask internal pattern 821, and the second optical mask internal pattern 831 of the optical mask 801. For example, the mask film pattern 301 may include the rectangular edge pattern 310, a plurality of first internal patterns 321, and a plurality of second internal patterns 331. The plurality of first internal patterns 321 may be parallel to a pair of opposite sides of the edge pattern 310. The second internal patterns 331 and the first internal patterns 321 may be alternately disposed. The first internal pattern 321 and the second internal pattern 331 may be spaced apart from both sides of the edge pattern 310. Second openings 351, defined by the edge pattern, the first internal pattern, and the second internal pattern 310, 321, and 331 of the mask film pattern 301, may connect all of one end of the first openings 340. The widths W2 and W3 of the second openings 351 may be larger than the width W1 of the first opening 340. Specifically, the width W2 of the second opening 351 may be at least two times larger than the width W1 of the first opening 351. The difference in the widths contributes to simplify the following processes, as in the previously described embodiment.

According to the semiconductor integrated circuit and the method of manufacturing the same according to embodiments of the invention, trenches may be formed that are separate from each other by changing the shape of the optical mask. Thus, an additional trench separation process is not needed. Therefore, the number of processes may be reduced. Thus, process time and cost may be reduced. Since the gate electrodes may be disposed at short intervals, integration of the semiconductor integrated circuit may be increased. Further, the gate electrodes may be formed in the semiconductor substrate, increasing channel length.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor integrated circuit, comprising:
   a semiconductor substrate;
   a plurality of trenches formed to extend in one direction in the semiconductor substrate;
   at least one connecting trench connecting at least two of the plurality of trenches to each other;
   trench transistors including a plurality of gate electrodes, each gate electrode partially filling a corresponding trench; and
   a capping layer filling the at least one connecting trench such that the capping layer electrically insulates the at least two of the plurality of trenches from each other.

2. The semiconductor integrated circuit as claimed in claim 1, wherein the at least one connecting trench connects ends of the at least two of the plurality of trenches.

3. The semiconductor integrated circuit as claimed in claim 1, further comprising a second capping layer on the gate electrodes in the trenches, the second capping layer and the capping layer filling the at least one connecting trench being formed of an insulating material.

4. The semiconductor integrated circuit as claimed in claim 1, wherein:
   the semiconductor substrate further comprises an element separation region that defines an active region, and
   the at least one connecting trench is located in the element separation region.

5. The semiconductor integrated circuit as claimed in claim 1, wherein the at least one connecting trench connects four trenches.

6. The semiconductor integrated circuit as claimed in claim 1, wherein the at least one connecting trench connects all of the plurality of trenches in the semiconductor substrate.

7. The semiconductor integrated circuit as claimed in claim 1, wherein the gate electrodes do not protrude above an upper surface of the semiconductor substrate.

8. A method of manufacturing a semiconductor integrated circuit, the method comprising:
   forming a plurality of trenches and at least one connecting trench in a semiconductor substrate, the plurality of trenches extending in one direction, the at least one connecting trench connecting at least two of the plurality of trenches;
   partially filling the plurality of trenches to form a corresponding plurality of gate electrodes; and
   filling the at least one connecting trench to form a capping layer such that the at least two of the plurality of trenches are electrically insulated from each other.

9. The method as claimed in claim 8, wherein forming the plurality of trenches and the at least one connecting trench comprises:
   forming an etching auxiliary film on the semiconductor substrate;
   forming a mask film pattern on the etching auxiliary film, the mask film pattern including first openings that extend in one direction and at least one second opening, the at least one second opening connecting at least two of the first openings; and forming two separated trenches in a region of the semiconductor substrate corresponding to each of the first openings and forming the at least one connecting trench in a region of the semiconductor substrate corresponding to the at least one second openings.

10. The method as claimed in claim 9, wherein a width of the at least one second opening is larger than a width of the first opening.

11. The method as claimed in claim 10, wherein the width of the at least one second opening is at least two times larger than the width of the first opening.

12. The method as claimed in claim 9, wherein forming the two separated trenches comprises:

sequentially depositing an etching inductive film and a separation insulating film on the mask film pattern;

removing the separation insulating film other than in the first openings; and etching the etching inductive film.

13. The method as claimed in claim 12, wherein:

the etching inductive film in the first openings is separated into two portions along both sides of the separation insulating film remaining in the first openings after removing the separation insulating film, and removing the separation insulating film includes isotropic etching that exposes the etching inductive film in the second openings.

14. The method as claimed in claim 12, wherein:

the etching inductive film and the etching auxiliary film are made of the same material, and etching the etching inductive film includes etching the etching inductive film and the etching auxiliary film together.

15. The method as claimed in claim 14, wherein:

the etching auxiliary film and the semiconductor substrate are made of the same material, and etching the etching inductive film includes etching the etching inductive film, the etching auxiliary film, and the semiconductor substrate together.

16. The method as claimed in claim 9, wherein:

forming the gate electrodes includes depositing a conductive material filling the plurality of trenches, on sides and a bottom surface of the at least one connecting trench, and on a surface of the mask film pattern, and removing the conductive material from the at least one connecting trench and leaving a portion of the conductive material in portions of trenches in the semiconductor substrate, separating the gate electrodes from each other.

17. The method as claimed in claim 16, wherein filling the at least one connecting trench includes forming the capping layer on the gate electrodes in the trenches.

18. The method as claimed in claim 17, further comprising:

etching-back the etching auxiliary film to remove the etching auxiliary film.

19. The method as claimed in claim 9, further comprising forming a source/drain region in the semiconductor substrate before forming the etching auxiliary film.

20. The method as claimed in claim 19, further comprising forming an element separation region in the semiconductor substrate before forming the source/drain region.

21. The method as claimed in claim 9, wherein the at least one second opening connect all of the first openings.

22. A method of manufacturing a semiconductor integrated circuit, the method comprising:

forming an etching auxiliary film on a semiconductor substrate;

forming a mask film pattern on the etching auxiliary film, the mask film pattern including a plurality of first openings that extend in one direction and at least one second opening connecting at least two of the plurality of first openings;

sequentially forming an etching inductive film and a separation insulating film on the mask film pattern;

removing the separation insulating film except for a portion of the separation insulating film in the first openings;

etching the etching inductive film, forming two separated trenches in a region of the semiconductor substrate corresponding to each of the first openings, and forming at least one connecting trench in a region of the semiconductor substrate corresponding to the at least one second opening;

partially filling each of the plurality of trenches to form gate electrodes in the semiconductor substrate; and filling the at least one connecting trench to form a capping layer such that the gate electrodes in the two separated trenches are electrically insulated from each other.

23. The method as claimed in claim 22, wherein a width of the second opening is at least two times larger than a width of the first opening.

24. The method as claimed in claim 22, wherein:

the etching inductive film in the first openings is separated into two portions along both sides of the separation insulating film remaining in the first openings after removing the separation insulating film, and removing the separation insulating film includes isotropic etching to expose the etching inductive film in the at least one second opening.

* * * * *